(12) United States Patent
Bell et al.

(10) Patent No.: US 7,062,425 B1
(45) Date of Patent: Jun. 13, 2006

(54) METHOD AND APPARATUS FOR AUTOMATED ENUMERATION, SIMULATION, IDENTIFICATION AND/OR IRRADIATION OF DEVICE ATTRIBUTES

(75) Inventors: Risto D. Bell, San Jose, CA (US); J. Daniel Merchant, Starkville, MS (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/410,160

(22) Filed: Sep. 30, 1999

(51) Int. Cl.
*G06F 17/50* (2006.01)
*H01L 29/73* (2006.01)
*G11C 29/00* (2006.01)

(52) U.S. Cl. .................. 703/14; 703/15; 257/209; 714/718

(58) Field of Classification Search .............. 703/14; 257/50; 438/132
See application file for complete search history.

(56) References Cited

U.S. PATENT DOCUMENTS

| | | | | |
|---|---|---|---|---|
| 4,658,400 A | * | 4/1987 | Brown et al. ............... | 371/325 |
| 5,539,652 A | * | 7/1996 | Tegethoff ..................... | 703/14 |
| 5,568,408 A | * | 10/1996 | Maeda ......................... | 364/580 |
| 5,576,985 A | * | 11/1996 | Holtz .......................... | 365/49 |
| 5,764,878 A | * | 6/1998 | Kablanian et al. ............ | 714/6 |
| 5,821,160 A | * | 10/1998 | Rodriguez et al. ........... | 438/601 |
| 5,828,673 A | * | 10/1998 | Mikawa et al. .............. | 714/718 |
| 5,841,967 A | * | 11/1998 | Sample et al. ................ | 714/33 |
| 5,850,348 A | * | 12/1998 | Berman ........................ | 716/6 |
| 5,970,000 A | * | 10/1999 | Kirihata et al. ............. | 365/200 |
| 6,006,311 A | * | 12/1999 | Arimilli et al. ............. | 711/133 |
| 6,026,228 A | * | 2/2000 | Imai et al. .................. | 716/18 |
| 6,065,134 A | * | 5/2000 | Bair et al. .................... | 714/7 |
| 6,067,259 A | * | 5/2000 | Handa et al. ............... | 365/200 |
| 6,081,910 A | * | 6/2000 | Mifsud et al. ............... | 714/718 |
| 6,115,300 A | * | 9/2000 | Massoumi et al. .......... | 365/200 |
| 6,181,614 B1 | * | 1/2001 | Aipperspach et al. ....... | 365/200 |
| 6,199,031 B1 | * | 3/2001 | Challier et al. .............. | 703/14 |
| 6,202,044 B1 | * | 3/2001 | Tzori .......................... | 703/28 |
| 6,233,540 B1 | * | 5/2001 | Schaumont et al. .......... | 703/14 |
| 6,397,349 B1 | * | 5/2002 | Higgins et al. ............. | 714/7 |

OTHER PUBLICATIONS

Mark Arnold, Anthony Wallace, Jerry Cupal, John Cowles, "Towards a Formal Model of Hardware Synthesized from Verilog" IEEE 1996, pp. 60-66.*

* cited by examiner

*Primary Examiner*—Paul L. Rodriguez
*Assistant Examiner*—Dwin M. Craig
(74) *Attorney, Agent, or Firm*—Christopher P. Maiorana, PC

(57) ABSTRACT

A method of automated enumeration of one or more devices comprising the steps of (A) generating an enumeration of a plurality of fuses and (B) compiling data for each one of said plurality of fuses, wherein the data comprises (i) one or more schematic path data, (ii) one or more simulation path data and/or (iii) one or more physical location data.

20 Claims, 3 Drawing Sheets

ID OF THE INVENTION

The present invention relates to automated enumeration generally and, more particularly, to a method, software and/or apparatus for automated enumeration, simulation identification and/or irradiation of device attributes.

BACKGROUND OF THE INVENTION

Conventional methods exist to automate enumeration of all fuse locations on a die. The conventional methods do not associate fuse locations with a schematic path and/or a verilog path. Conventional methods exist to manually associate a fuse path to a fuse location or the fuse location to the fuse path, one at a time. The conventional methods to manually associate the fuse path to the fuse locations, or vise versa, use a layout versus schematic (LVS) cross-probe user-interface. Conventional verilog simulation paths are derived by manual translation of schematic paths aided by visual inspection of a netlist.

Additionally, conventional methods do not effectively collect thorough and accurate fuse path versus fuse location data. The manual LVS cross-probe cannot process the fuse path versus fuse location data for large numbers of devices in a timely, cost-effective manner. Without a thorough and accurate path versus location data, methods to verify repair programs and redundancy documentation are tedious and error prone.

SUMMARY OF THE INVENTION

The present invention concerns a method of automated enumeration of one or more devices comprising the steps of (A) generating an enumeration of a plurality of fuses and (B) compiling data for each one of said plurality of fuses, wherein the data comprises (i) one or more schematic path data, (ii) one or more simulation path data and/or (iii) one or more physical location data.

The objects, features and advantages of the present invention include providing a method and/or apparatus that may provide (i) automatic enumeration of all fuses in the design and collection of a schematic path and annotated properties for each fuse, (ii) automatic determination of a verilog simulation netlist path for each fuse, (iii) automatic determination of a physical location for each fuse, (iv) automatic verification of fuse locations against additional identifying shapes drawn in the layout, (v) coordinates, such as from repair program output, are automatically translated to verilog programming statements (vi) automatic and/or manual ad-hoc queries and searches to isolate groups of fuses for tabular listings or to program them in verilog, (vii) automatic translation of existing program statements to their physical locations, (viii) manual annotation of the schematic hierarchy at multiple levels with descriptive fuse properties, and/or (ix) manual searches or look-ups based on expression matching against this description property.

Additionally, fuse data is generally enumerated and collected from the design flow into a separate file. The file may thereafter be used independently of the original design flow data and tools. Traditional access to cross-probing functionality of simulation netlisters and LVS tools may require simultaneous availability of (i) original design data, (ii) specific version of vendor software, (iii) specific architecture of host computer, and (iv) licenses to enable the vendor software.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
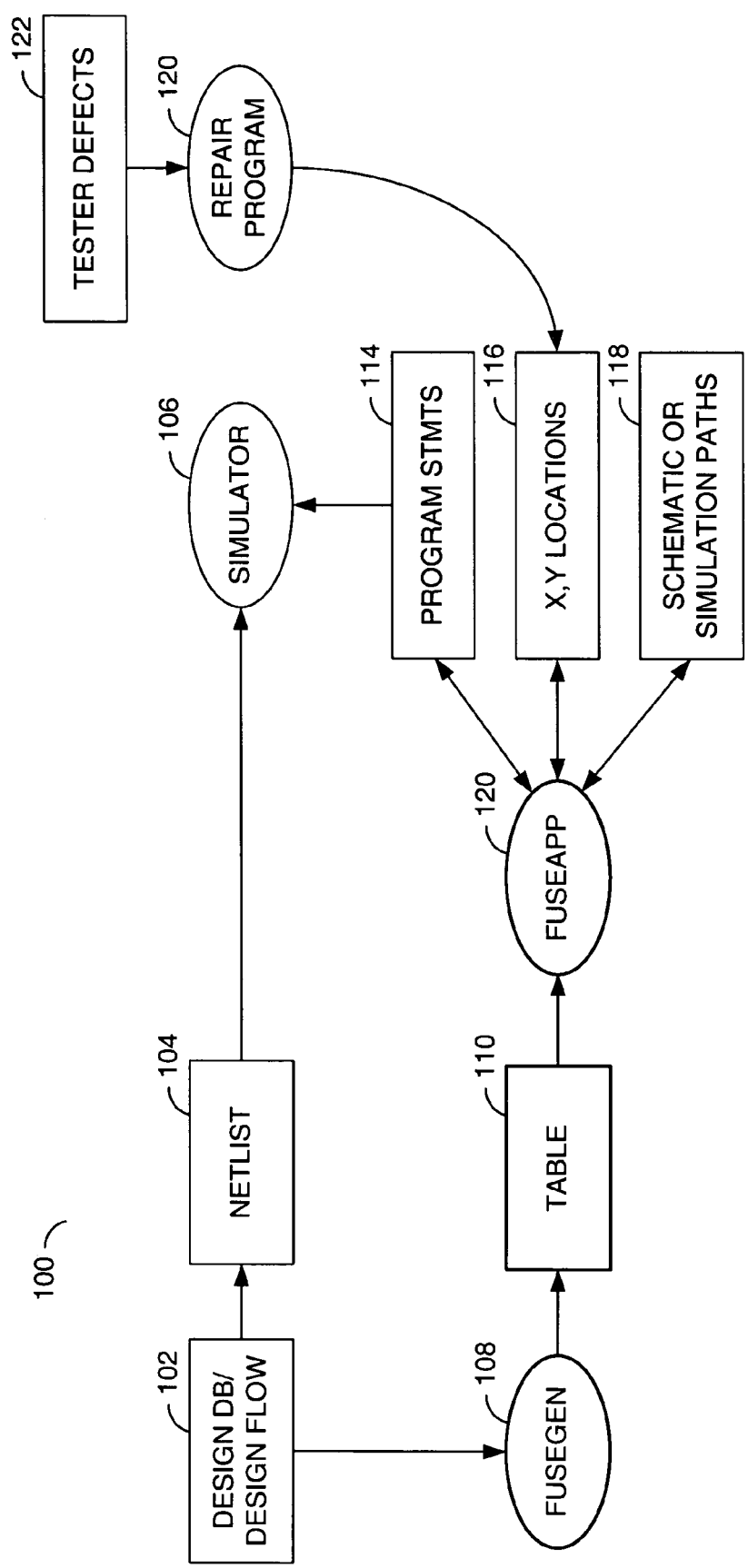
FIG. 1 is a block diagram of a preferred embodiment of the present invention.

Referring to FIG. 1, a block diagram of a method 100 is shown in accordance with a preferred embodiment of the present invention. Fuses in a design may be enumerated and data collected and stored in a file. The data may include schematic path data, verilog simulation path data and/or physical fuse location data. Multiple representations of the design and/or data may be accessible by other tools, such as netlister and/or layout versus schematic (LVS). The data may be used to enumerate the fuses. The data may be implemented in order to test and/or repair the design. References to "verilog" refer to the verilog hardware description language (HDL) as defined by the IEEE 1364-1995 standard.

The file may be implemented to answer look-ups and translations as directed by an operator or apparatus. Automated programming of fuses in a design simulation may verify (i) accuracy of a laser repair program and/or (ii) design redundancy functionality. The file may also be implemented to ensure accurate documentation of redundancy methodology for the design. The look-ups and translations may be constrained to include and/or exclude fuses based on (i) physical location range specifications, and/or (ii) exact or pattern matching of (a) schematic paths, (b) verilog paths and/or (c) description properties.

The method 100 may comprise a design data block 102, a netlist block 104, a simulation block 106, a generation block 108, a table block 110, an application block 112, a program statement block 114, a location block 116, a schematic/simulation block 118, a repair program or repair block 120 and a test block 122. The generation block 108 may receive fuse data from the design data block 102. The generation block 108 may write the fuse data into a file and perform error checking on the file.

The generation block 108 may perform enumeration of fuses and the collection (compilation) of data for each fuse. The schematic design data may comprise (i) schematic path data and (ii) property data formed from hierarchical contributions. For each fuse, the generation block 108 may generate verilog path data. The generation block 108 may generate the verilog path data depending on the methodology implemented in netlist block 104. The generation block 108 may generate the verilog path data using either a first or a second method.

The first method may translate the schematic path data to the verilog path data via dead-reckoning. The first method may implement the same algorithm known to be used by the netlist block 104. The netlist block 104 may be implemented as FNL-based netlisters, HNL-based netlisters, or any other type netlister in order to meet the criteria of a particular implementation. The second method may map the schematic path data to the verilog path data by direct lookup using netlister map files that may be implemented within the netlist block 104. An associated netlister API (application-programming-interface) may be represented in the block 102. The netlister map files and the netlister API may be implemented within the netlist block 104. If an operator or apparatus requests a non-LVS mode (for example if clean LVS is not available yet), the fuse generation block 108 may write the fuse data collected to a file and terminate.

The LVS data is generally used to collect the physical location data for each schematic path. LVS tools may access the physical location data in one of two methods. The first method may comprise a LVS tool that may provide (i) one or more APIs or (ii) one or more cross-referenced output files. The schematic path is generally translated from the files to one or more matching x/y device locations through one or more steps. The second method may comprise a LVS tool that may provide (i) an API or (ii) cross-referenced output files. The second method may translate a device x/y location into one or more matching schematic device paths.

When the LVS data is available, the data is generally used to extract partial information of which fuses may be electrically connected in parallel. The information is generally recorded to warn an operator or apparatus in the event of a request to program a strict subset of such a parallel group.

When the LVS data is available and is requested by an operator or apparatus, fuse locations given by the LVS may be compared against additional drawn layout shapes. If differences are found in the fuse locations, a heuristic is generally used to attempt to matchup the differences. The heuristic may report the differences in a user-friendly manner to help an operator make layout corrections if desired. For example the LVS and the drawn layout may report different fuse locations. The fuse locations may be closer to each other than to any other unmatched locations. The close fuse locations may be listed together as probable intended matches. The generator block 108 may write the fuse data collected to the file and terminate. The generation block 108 may present the file to the table 110. The fuse data for each fuse of the device may be stored in the table 110.

The application block 112 may receive constraints and options given by the operator or another apparatus. The application block 112 may read each fuse data stored in the table 110 while applying the constraints to decide whether to retain or discard the fuse data.

The application block 112 may present one or more matching fuses in a first or a second format. The first format may present a tabular listing to the location block 116. The second format may present verilog programming statements to the program statements block 114. Options support how to sort fuses prior to output. The application block 112 may control the order in which fields may be presented in the tabular method. The application block 112 may name a verilog path name prefix to be applied to the verilog paths, in order to program a device nested within one or more test-bench modules.

If the one or more matching fuses only partially represent a group of electrically parallel fuses (as indicated by grouping information stored within the fuse database file), warnings may be generated.

Construction of the repair program 120 may rely on part-specific redundancy information and errors found after a first-silicon delay part production. The repair program 120 may receive the errors from the defect block 122. The repair program 120 may be exercised in advance of the first-silicon for specific part failures. The repair program 120 may predict fuse locations that, if programmed, may correct a part experiencing failure. The method 100 may provide an easy and reliable method to perform simulations that emulate a design as if those locations were programmed on the die by the laser.

Figure 2:
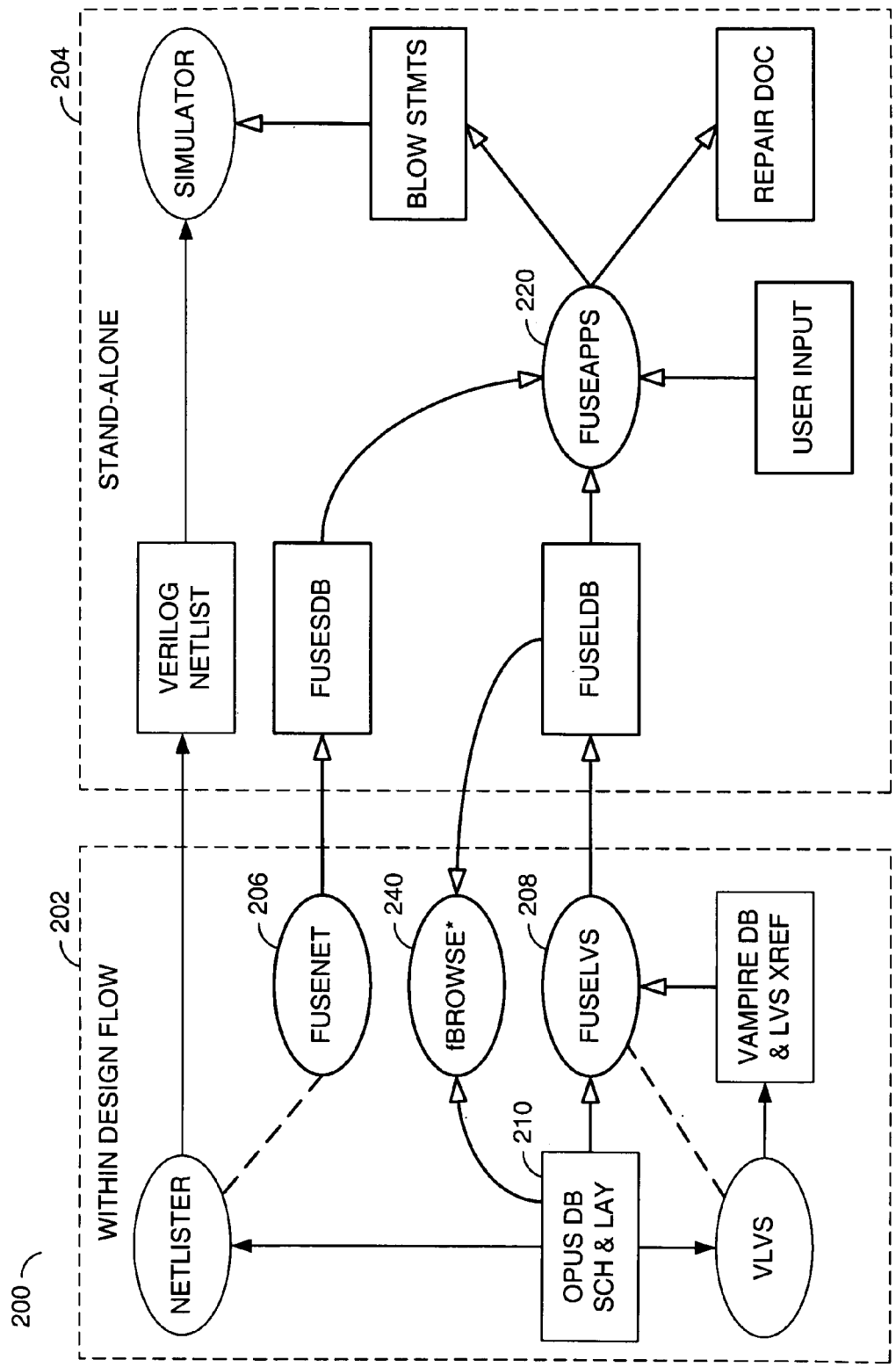
FIG. 2 is a block diagram of an example apparatus implementing the present invention.

Referring to FIG. 2, a block diagram of an example apparatus 200 implementing the present invention is shown. The circuit 200 may comprise a design flow block or design flow circuit 202 and a stand-alone block or stand-alone circuit 204. The design flow block or circuit 202 may comprise a fuse network block 206, a fuse LVS block 208 and a design/database circuit 210. The fuse network block 206 and the fuse LVS block 208 may provide data to the stand-alone block or circuit 204. In one example the design/database circuit 210 may be implemented as a design flow and Opus design database.

The fuse network block 206 may collect data relevant to (i) schematic paths, (ii) properties, (iii) hierarchy and/or (iv) verilog paths. The fuse LVS block 208 may collect data relevant to (i) layout locations, (ii) parallel fuses, and/or (iii) LVS cross-reference to schematic paths.

The fuse network block 206 and the fuse LVS block may be implemented to drive applications within the stand-alone circuit 204. The stand-alone circuit 204 may comprise a fuse applications block 220. The fuse application block 220 may utilize either or both the fuse network block 206 and/or the fuse LVS block 208. The fuse application block may determine what data must be accessed and when the data will be accessed (e.g., within a software design tool with or without the flow schematic data only or schematic data plus layout data).

The fuse application block 220 may write one or more ASCII report files. A repair memo, also referred to as a repair file, may be manually assembled from the report files. One or more steps may be manually determined and may be incorporated into the repair memo or file. The repair memo or file may be exercised to predict coordinates to program. The coordinates may be mapped to verilog paths. Simulations of the verilog paths may be performed to verify the expected function.

The design flow circuit 202 may further comprise a browse block 240. The browse block 240 may capture, in the schematic, enough knowledge of the fuses to elevate the fuses to a higher level of abstraction. The user may describe, in application terms, the desired redundancy event. For example, the redundancy event may comprise replacing column C in quadrant Q. The coordinates to program may be automatically determined. However, the simulation may still be required to verify the function (e.g., to verify that the application specific knowledge captured in the schematic describing specific intent of each fuse is correct).

The Vampire LVS database may be used to generate a fuse database (e.g., fuse.fdb). The fuseGen may be run in the following ways (i) as a side effect of Vampire LVS, (ii) by invoking a skill function from the CIW, and/or (iii) from the command line. The fuseGen may also be statically configured (e.g., using trf variables) to run for a set of specified cells. The fuseGen may also be run on a design tool schematic database (e.g., Opus) to get schematic instance paths, verilog paths and info strings for each fuse in the schematic hierarchy. The FuseGen may also be configured to run during verilog netlisting.

A file fuse.txt may be a text file listing all fuse co-ordinates. User inputs may be provided to fuseapp to output only certain groups of fuses (based on criteria defined in the user inputs). The fuse.txt file (or other text file(s)) generated via fuseapp) may be included in the fuse repair document.

Figure 3:
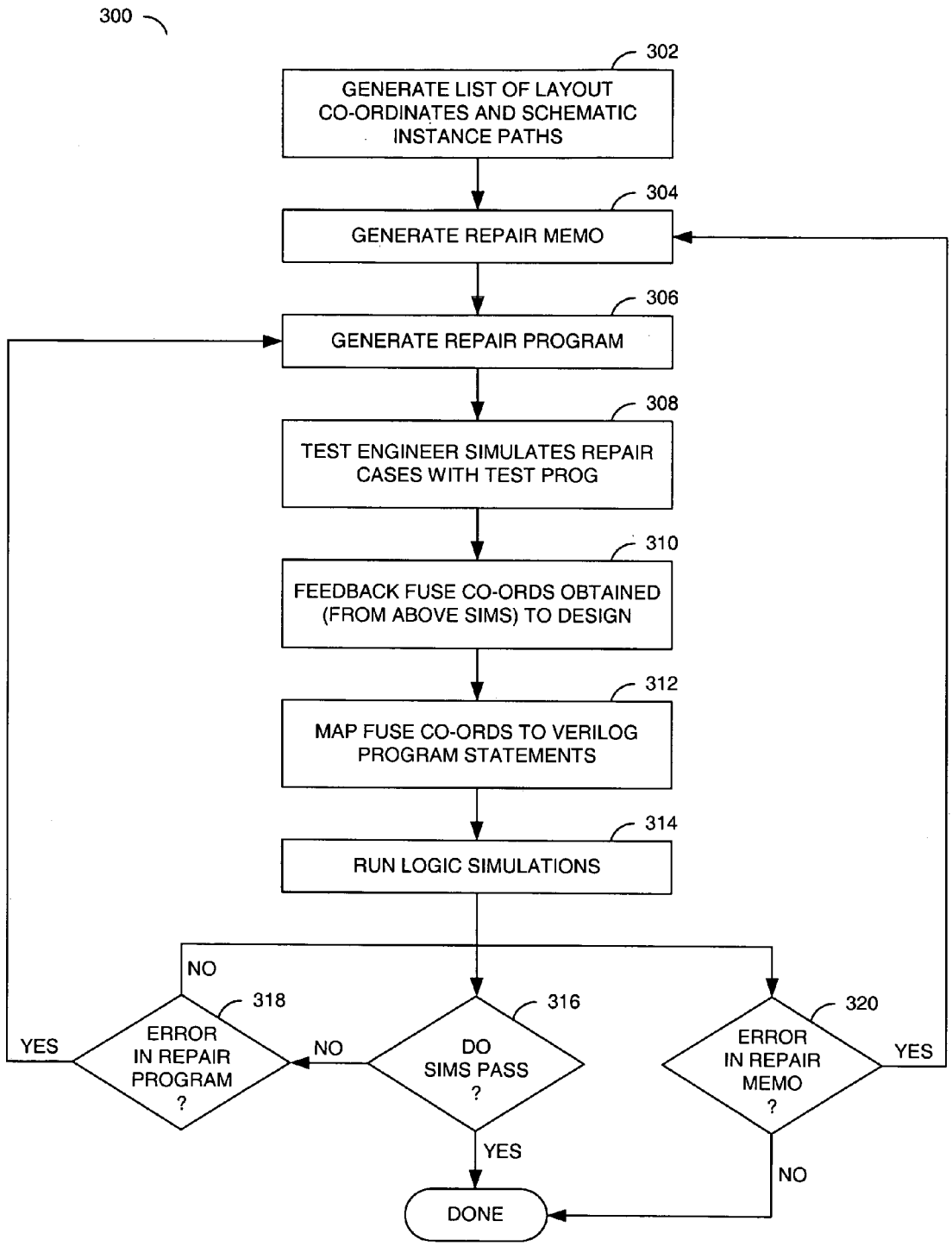
FIG. 3 is a flow chart of an operation of the method of FIG. 1.

Referring to FIG. 3 a flow chart 300 of the operation of the method 100 is shown. The flow chart 300 may describe the procedure for using the present invention. The flow chart 300 may comprise a generate block 302, a repair memo block 304, a repair program 306, a test simulate bock 308, a feedback block 310, a map block 312, a logic simulation block 314, a SIMS check block 316, an error program check block 318 and an error memo check block 320.

The generate block 302 may generate a list of layout co-ordinates and schematic instance paths. The generation block 302 may initialize the fuse generation block 108. Next, the repair memo block 304 may initialize the fuse application block 112. The fuse application block 112 may generate a repair memo. The repair program block 306 may implement the repair memo generated by the repair memo block 304 into a repair program.

The test engineer may run a set of simulations to check the laser repair program. The output of these simulations may be a list of co-ordinates of fuses that need to be blown for the desired repair and the corresponding logical address used. The co-ordinates of the fuse may be stored in the location block 116. The output of the simulation is generally fed back to the design engineer.

The feedback block 310 may allow the Design engineer to feed the sets of co-ordinates from the simulations to the fuse application block 112. The fuse application block 112 may generate a set of verilog statements that may be used to program selected fuses. The map fuse block 312 may map fuse co-ordinates to the verilog program statements stored in the program statements block 114. The logic simulation block 314 may allow the design engineer to run a simulation to check the correctness of the blown fuses utilizing the logical address information.

In case of a discrepancy found in the logic simulation block 314 the SIMS check block 316 may present (i) the repair program to the repair program block 306 or (ii) the repair memo to the repair memo block 304.

In this alternative, essentially the blocks 302, 314, a reversed block 312 are performed first. The particular test cases "sufficient to ensure coverage" are documented in the repair memo block 304. Such documentation may include coordinates (e.g., derived thru an inverse of block 312: program statements are mapped to fuse coordinates (using block 112) and the coordinates are embedded in the memo block 304). The test engineer may then create the repair program as before (e.g., the block 306) from the repair memo block 304. The test engineer may then employ the repair program in a simulate-mode (e.g., in the block 308) to output coordinates from each test case. Next, a compare of these coordinates to the coordinates documented in the repair memo is performed that may decide whether an error exists in the memo or the program. Such a comparison may be similar to the block 316, although the "simulation" being verified is generally very different. For a program error, the blocks 306, 308, and 316 may be repeated. For a memo error, the blocks 304, 306, 308, and 316 may be repeated.

While the invention has been particularly shown and described with reference to the preferred embodiments thereof, it will be understood by those skilled in the art that various changes in form and details may be made without departing from the spirit and scope of the invention.

The invention claimed is:

1. A method of verifying a repair of a design, comprising the steps of:
   (A) generating an enumeration of a plurality of fuses in said design;
   (B) compiling data for each of said fuses, wherein said data comprises simulation path data;
   (C) automatically generating a repair file based on said simulation path data, said repair file predicting at least one of said fuses to implement said repair to a specific failure of said design;
   (D) generating a repair program based on said repair file such that said at least one of said fuses simulates as programmed; and
   (E) simulating said design with said at least one of said fuses programmed for said repair to verify said repair.

2. The method according to claim 1, wherein said simulation path data comprises verilog simulation path data.

3. The method according to claim 1, wherein step (B) further comprises the sub-step of:
   generating a list of layout coordinates and paths in said design as part of said compiling.

4. The method according to claim 1, further comprising the steps of:
   generating a fuse report; and
   listing physical locations of a device in said design in response to said fuse report.

5. The method according to claim 1, further comprising the step of:
   verifying a function of said design in response to said repair program.

6. The method according to claim 1, further comprising the step of:
   listing an output of said repair program as a list of coordinates for said at least one of said fuses programmed for said repair in terms of a plurality of logical addresses.

7. The method according to claim 1, wherein said data further comprises schematic path data.

8. The method according to claim 7, wherein said schematic path data comprises at least one of a schematic path, a property, a hierarchy and a verilog path.

9. The method according to claim 1, wherein said data further comprises physical location data.

10. The method according to claim 1, further comprising the step of:
    mapping a plurality of co-ordinates of said fuses to a plurality of verilog program statements.

11. The method according to claim 1, further comprising the step of:
    checking said repair program for an error in response to said repair failing in said simulation.

12. The method according to claim 11, further comprising the step of:
    checking said repair file for an error in response to both said repair failing in said simulation and said repair program having no errors.

13. The method according to claim 1, further comprising the step of:
    translating at least one coordinate in said repair file to at least one verilog programming statement of said design.

14. The method according to claim 1, further comprising the step of:
    verifying a plurality of fuse locations for said fuses against at least one identifiable shape drawn in a layout of said design.

15. The method according to claim 1, further comprising the step of:
recording information identifying said fuses electrically connected in parallel to each other.

16. An apparatus comprising:
a first circuit configured to enumerate a plurality of fuses in a design; and
a second circuit configured to (i) compile data for each of said fuses, wherein said data comprises simulation path data (ii) generate a repair file based on said simulation path data, said repair file predicting at least one of said fuses to implement said repair to a specific failure of said design, (iii) generate a repair program based on said repair file such that said at least one of said fuses as programmed and (iv) perform a simulation said design with said at least one of said fuses programmed for a repair of said design to verify said repair.

17. The apparatus according to claim 16, wherein said first circuit is further configured to provide an elevation of said fuses at least one level of abstraction in said design.

18. The apparatus according to claim 16, wherein said first circuit is further configured to collect data relevant to said fuses that are grouped.

19. The apparatus according to claim 16, wherein said second circuit is further configured to write a report file.

20. An apparatus comprising:
means for generating an enumeration of a plurality of fuses in a design;
means for (i) compiling data for each of said fuses, wherein said data comprises simulation path data (ii) generating a repair file based on said simulation path data, said repair file predicting at least one of said fuses to implement said repair to a specific failure of said design, (iii) generating a repair program based on said repair file such that said at least one of said fuses as programmed and (iv) simulating said design with at least one of said fuses programmed for a repair of said design to verify said repair.

* * * * *